(12) United States Patent
Koike et al.

(10) Patent No.: US 8,120,171 B2
(45) Date of Patent: Feb. 21, 2012

(54) POWER DRIVE UNIT INCLUDING A HEAT SINK AND A FASTENER

(75) Inventors: Tatsuo Koike, Kakuda (JP); Motoaki Somaki, Kakuda (JP); Masashi Hayasaka, Kakuda (JP); Shigeharu Matsusaka, Kakuda (JP); Kazuya Nagasawa, Kakuda (JP)

(73) Assignee: Keihin Corporation, Shinjuku-ku, Tokyo (JP)

( * ) Notice: Subject to any disclaimer, the term of this patent is extended or adjusted under 35 U.S.C. 154(b) by 216 days.

(21) Appl. No.: 12/292,630

(22) Filed: Nov. 21, 2008

(65) Prior Publication Data

US 2009/0168358 A1 Jul. 2, 2009

(30) Foreign Application Priority Data

Dec. 26, 2007 (JP) .................................. 2007-333581
Dec. 26, 2007 (JP) .................................. 2007-333582
Dec. 26, 2007 (JP) .................................. 2007-333583

(51) Int. Cl.
*H01L 23/34* (2006.01)
*H05K 7/20* (2006.01)
*F28F 7/00* (2006.01)
*A47G 1/10* (2006.01)

(52) U.S. Cl. ........ 257/719; 361/709; 361/715; 361/719; 165/80.2; 174/16.3; 257/718; 24/458; 248/316.7

(58) Field of Classification Search .......... 361/709–710, 361/715, 719, 704; 165/80.1–80.3, 185; 174/15.1, 16.1, 16.3; 257/718–719; 24/458–459, 24/520; 248/316.7; 180/65.1, 68.1, 65.21

See application file for complete search history.

(56) References Cited

U.S. PATENT DOCUMENTS

| | | | | | |
|---|---|---|---|---|---|
| 4,218,695 | A | * | 8/1980 | Egerbacher et al. | 257/785 |
| 4,224,663 | A | * | 9/1980 | Maiese et al. | 363/144 |
| 4,591,896 | A | * | 5/1986 | Kikuchi | 257/738 |
| 5,483,103 | A | * | 1/1996 | Blickhan et al. | 257/718 |
| 5,648,889 | A | * | 7/1997 | Bosli | 361/704 |
| 5,825,088 | A | * | 10/1998 | Bartlow | 257/712 |
| 5,825,089 | A | * | 10/1998 | Valenti et al. | 257/718 |
| 5,912,804 | A | * | 6/1999 | Lawson et al. | 361/704 |
| 6,043,981 | A | * | 3/2000 | Markow et al. | 361/704 |
| 6,049,459 | A | * | 4/2000 | Edmonds et al. | 361/707 |
| 6,088,226 | A | * | 7/2000 | Rearick | 361/704 |

(Continued)

FOREIGN PATENT DOCUMENTS

JP 2000-152662 5/2000

(Continued)

*Primary Examiner* — Zachary M Pape
(74) *Attorney, Agent, or Firm* — Lau & Associates, LLC.

(57) ABSTRACT

A power drive unit is configured to comprise a heat sink, a power module pressed by a press member to the heat sink to be fastened thereto and a spring member that has a substantially circular shape and is installed between the power module and the press member. With this, the power module can be fastened to the heat sink without incurring layout limitation, degradation of heat release performance and the like. Also, since the power drive unit further includes a projection that protrudes from the press member to be engaged with an engagement hole bored at the center of the spring member, engagement of the projection of the press member with the engagement hole of the spring member functions to prevent displacement of the press member relative to the spring member, thereby making loads acting on the power modules uniform.

9 Claims, 8 Drawing Sheets

U.S. PATENT DOCUMENTS

| | | | |
|---|---|---|---|
| 6,566,879 B1 * | 5/2003 | Vanek et al. | 324/318 |
| 7,388,747 B2 * | 6/2008 | Yang et al. | 361/700 |
| 7,746,653 B2 * | 6/2010 | Negrut | 361/719 |
| 2004/0246662 A1 * | 12/2004 | Thurk et al. | 361/631 |
| 2010/0097765 A1 * | 4/2010 | Suzuki et al. | 361/699 |

FOREIGN PATENT DOCUMENTS

| | | |
|---|---|---|
| JP | 2001-274322 | 10/2001 |
| JP | 2004-087552 | 3/2004 |

* cited by examiner

POWER DRIVE UNIT INCLUDING A HEAT SINK AND A FASTENER

BACKGROUND OF THE INVENTION

1. Field of the Invention

This invention relates to a power drive unit, more specifically to a power drive unit equipped with power modules that are pressed by a press member to a heat sink to be fastened thereto.

2. Description of the Related Art

The hybrid vehicle that has emerged in various forms in recent years is equipped with an internal combustion engine, electric motor(s), battery or other such energy storage device, and the like. During driving of the hybrid vehicle, the engine and motor(s) are controlled in response to the driving or running conditions of the vehicle (e.g., whether the vehicle drives at high speed or low speed). The electric motor used in such a hybrid vehicle constitutes, for example, a brushless DC motor and is operated by forwarding direct current to U, V and W-phases of its stator from a power drive unit (PDU), more exactly from power modules in the PDU.

Japanese Laid-Open Patent Application No. 2004-87552 especially paragraphs 0008, 0009 and FIG. 1 etc.) teaches an example of a power drive unit in which a spring member of a pent-roof shape viewed in cross-section is installed on one side of a power module that is bored with a screw inserting hole, and a screw is inserted into the screw inserting hole through the spring member to, while pressing, fasten the power module to a heat sink.

However, the configuration to provide the screw inserting hole in the power module as in the prior art causes limitation in layout of electronic components, such as an IGBT (Insulated-Gate Bipolar Transistor) and diode, constituting the power module. Also, since a contact area between the power module and the heat sink decreases by a portion of the screw inserting hole, heat release performance of the power module disadvantageously lowers.

SUMMARY OF THE INVENTION

An object of the present invention is therefore to overcome the foregoing problem by providing a power drive unit whose power module is fastened to a heat sink without incurring layout limitation, degradation of heat release performance and the like.

In order to achieve the object, the present invention provides a power drive unit equipped at least with a heat sink and a power module that is pressed by a press member to the heat sink to be fastened thereto, wherein a spring member of a substantially circular shape is installed between the power module and the press member.

BRIEF DESCRIPTION OF THE DRAWINGS

The above and other objects and advantages of the present invention will be more apparent from the following description and drawings in which.

DETAILED DESCRIPTION OF THE PREFERRED EMBODIMENTS

Power drive units according to preferred embodiments of the present invention will now be explained with reference to the attached drawings.

Figure 1:
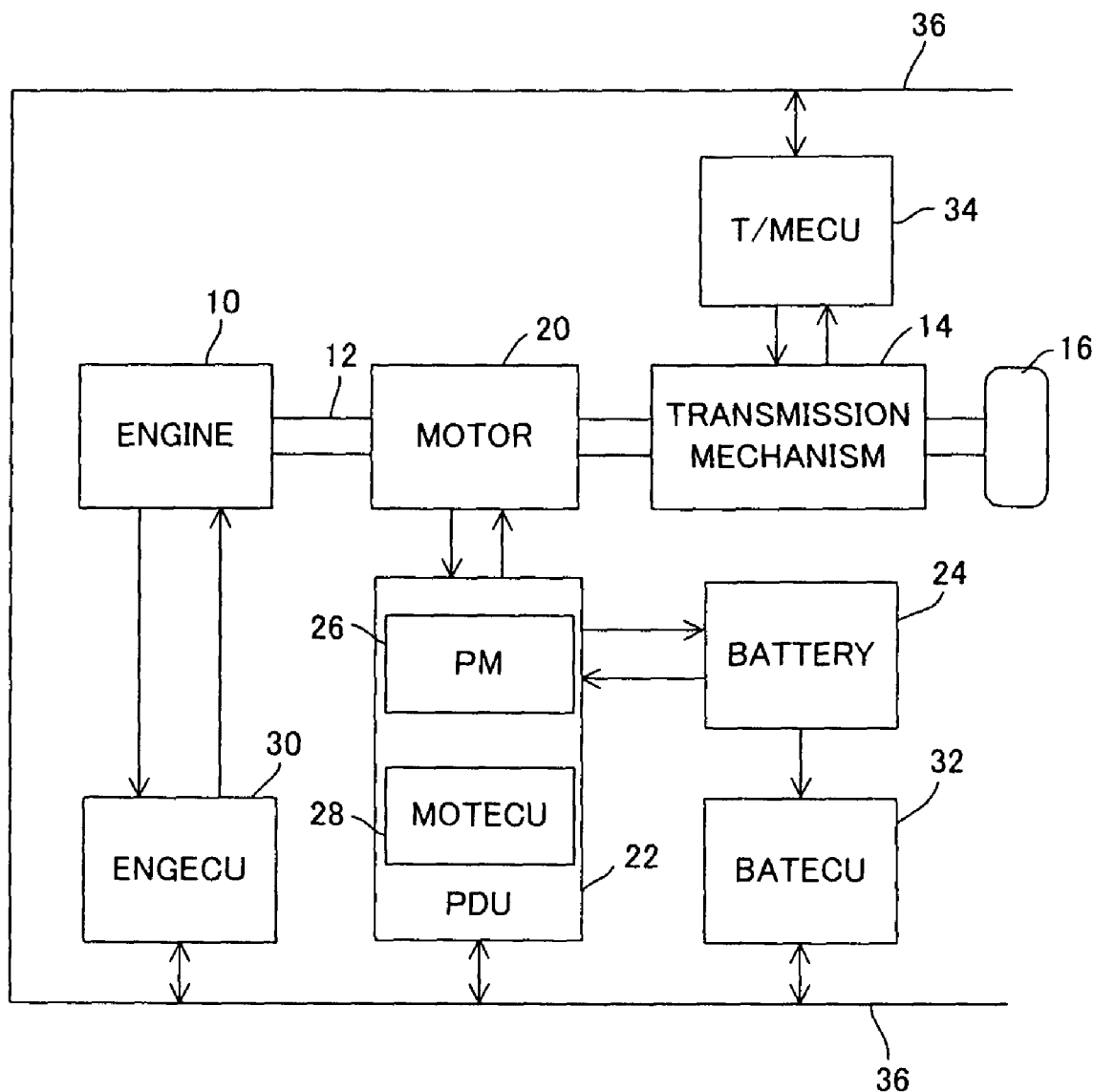
FIG. 1 is a schematic view showing an overall configuration of a hybrid vehicle control system including a power drive unit according to a first embodiment of the present invention.

FIG. 1 is a schematic view showing an overall configuration of a hybrid vehicle control system including a power drive unit according to a first embodiment of the present invention.

In FIG. 1, reference numeral 10 designates an internal combustion engine. The engine 10 is a gasoline-injection, spark-ignition, four-cylinder engine. The output of the engine 10 is inputted through a drive shaft 12 to a transmission mechanism 14. The transmission mechanism 14 includes an automatic transmission and is connected to driven wheels 16 (only one shown) of a hybrid vehicle (not shown) on which the engine 10 is mounted. The transmission mechanism 14 changes the speed of the engine output and transmits it to the driven wheels 16 for running the hybrid vehicle.

The drive shaft 12 is connected with or passes through an electric motor 20 between the engine 10 and the transmission mechanism 14. The engine 10 is started by supplying cranking current to the motor 20 and cranked by the motor 20, whereafter the motor 20 rotates so long as the engine 10 continues to run. The motor 20 is also supplied with current during acceleration to assist (speed up) the rotation of the engine 10. When the motor 20 is not being supplied with current, it rotates idly with the rotation of the engine 10. When the supply of fuel to the engine 10 is stopped during deceleration (fuel cutoff is implemented), the motor 20 converts the kinetic energy produced by rotation of the drive shaft 12 into electric energy and outputs the electric energy, thus operating as a generator that functions to regenerate or recover energy.

The motor 20 is connected through a power drive unit (PDU) 22 to a battery 24. The motor 20 comprises a brushless DC motor, i.e., an alternating current synchronous motor. The PDU 22, which is equipped with power modules (specifically, a three-phase inverter circuit; indicated as "PM" in FIG. 1; explained later) 26, a motor electronic control unit (MO-TECU) 28 that controls the operation of the motor 20 and the like, supplies direct current (electric power) supplied from or discharged by the battery 24 to the three-phase coil made up of U-, V- and W-phases of the motor 20 and also supplies power generated by regenerating the operation of the motor 20 to the battery 24 (i.e., charges the battery 24). Thus in the illustrated hybrid vehicle control system, the driving/regenerating operation of the motor 20 is controlled through the PDU 22. The battery 24 is composed of a suitable number of nickel-hydrogen (Ni-MH) cells connected in series.

The hybrid vehicle control system includes an engine electronic control unit (ENGECU) 30 that controls the operation of the engine 10, a battery electronic control unit (BATECU) 32 that calculates the state of charge (SOC) of the battery 24 and performs functions such as charge/discharge management, and a transmission electronic control unit (T/MECU) 34 that controls the operation of the transmission mechanism 14. The ENGECU 30 and other electronic control units (ECUs) comprise microcomputers and are connected with each other to communicate or exchange data via a bus 36.

Figure 2:
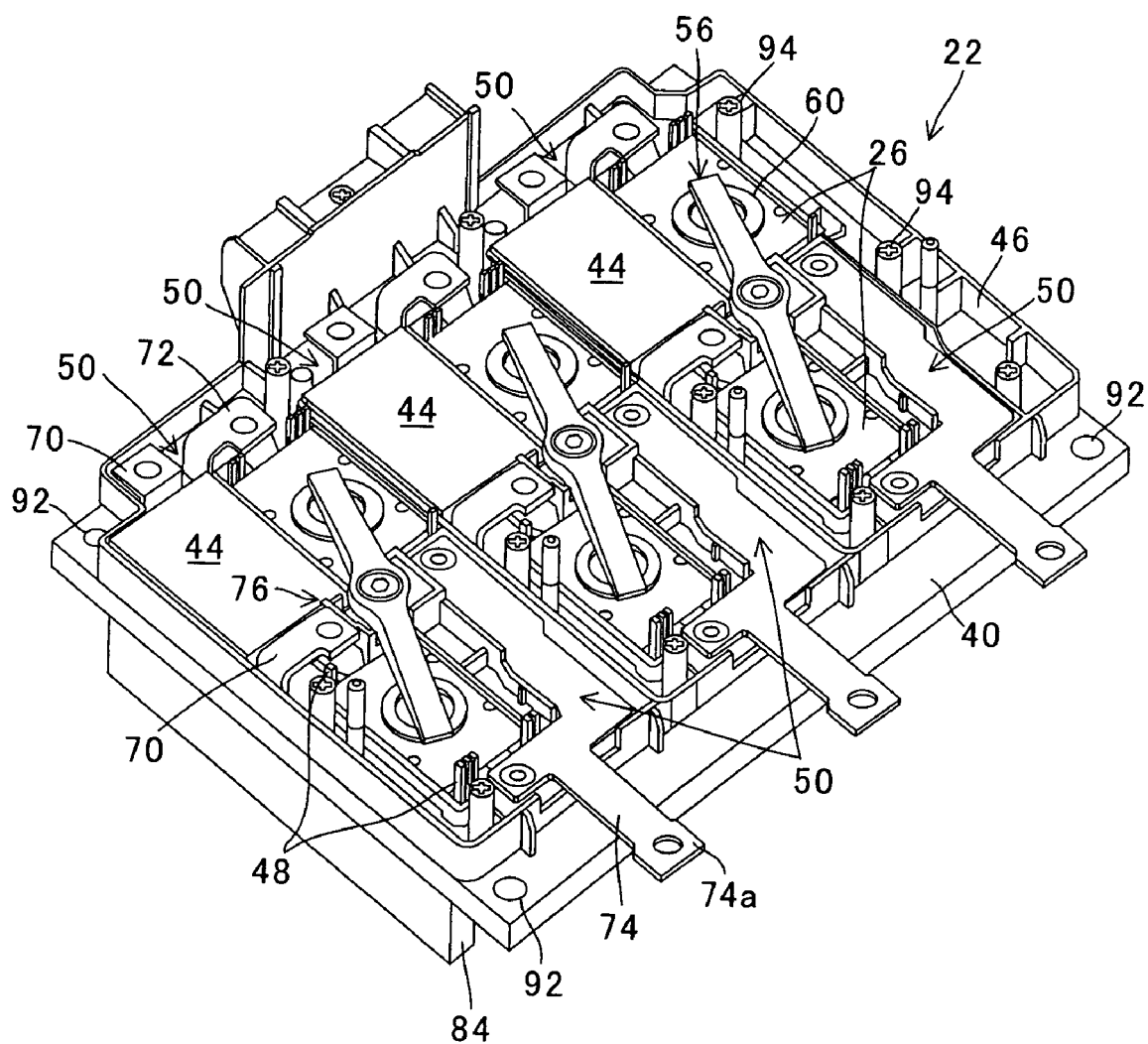
FIG. 2 is a perspective view of the power drive unit shown in FIG. 1.

The PDU 22 according to the first embodiment will now be explained in detail. FIG. 2 is a perspective view of the PDU 22 and FIG. 3 is a plan view thereof.

As illustrated, the PDU 22 comprises a heat sink 40, a plurality of, i.e., six power modules 26, a plurality of, i.e., three capacitors (smoothing capacitors) 44 connected to the power modules 26 to constitute a smoothing circuit and a case 46 that is attached to the heat sink 40 and accommodates the power modules 26, capacitors 44, pressing members which will be explained later and other components. Although the PDU 22 also comprises an electronic circuit board which constitutes the MOTECU 28 etc. and is connected to the power modules 26 through signal pins 48, and a cover which is attached to the heat sink 40 to cover the case 46 and the like, and other components, explanation and illustration are omitted here, as they are not directly related to the gist of this invention.

Components composing the PDU 22 will be explained. Each of the six power modules 26 is equipped with an IGBT (Insulated-Gate Bipolar Transistor; not shown) that constitutes the three-phase inverter circuit, whereby it is configured as the three-phase inverter circuit module. Specifically, one of the power modules having a high side switch (switch element) and another power module having a low side switch (switch element) are connected in series to form a single-phase inverter circuit and three single-phase inverter circuits are connected in parallel, whereby the six power modules 26 are configured as the three-phase inverter circuit modules.

Figure 3:
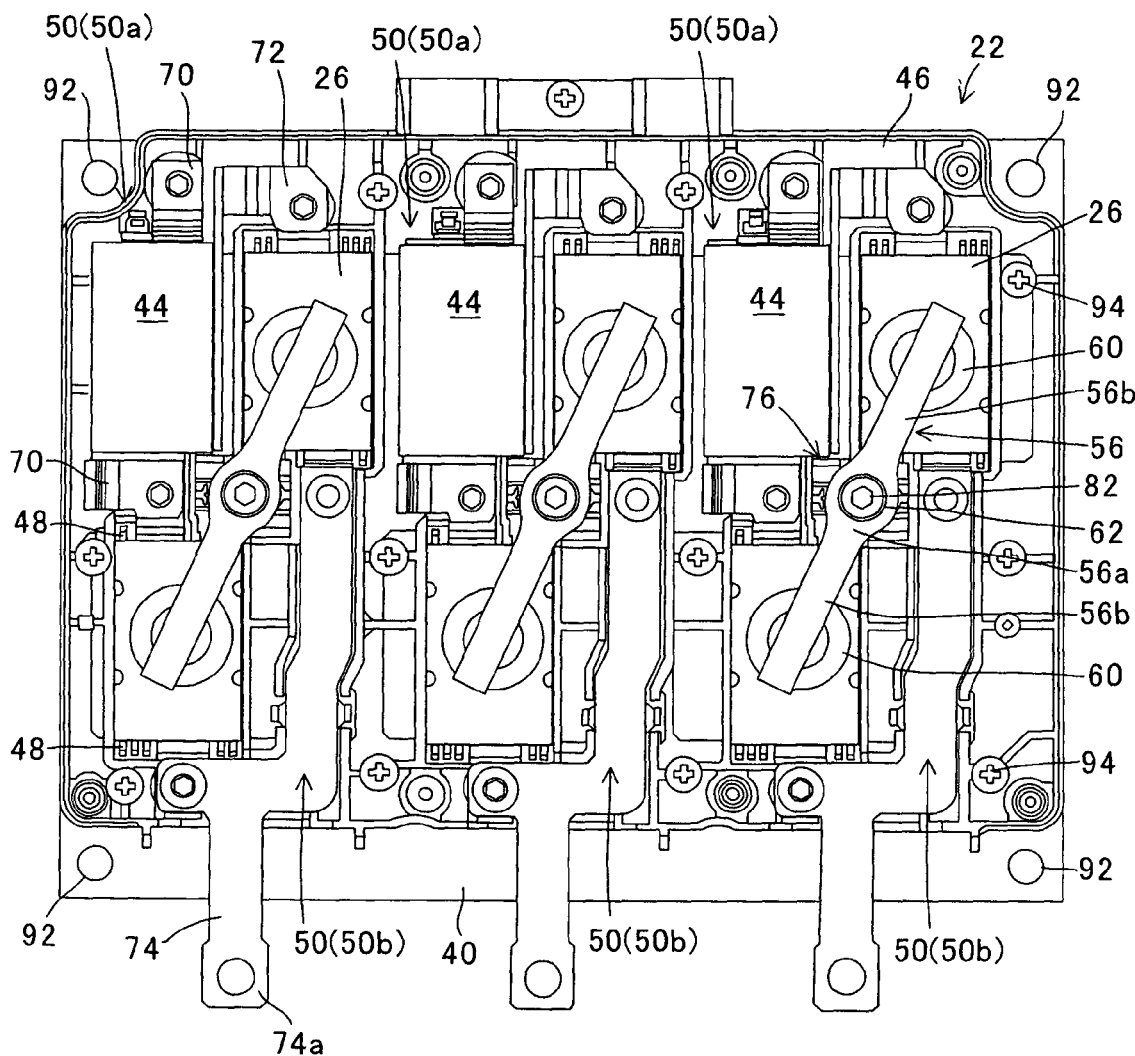
FIG. 3 is a plan view of the power drive unit shown in FIG. 2.
Figure 3:
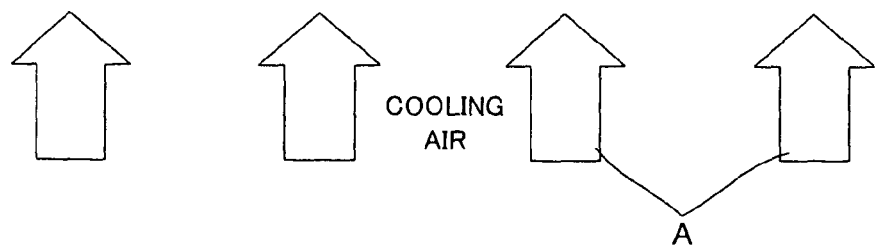

As shown in FIG. 3, the six power modules 26 are arranged in zigzag on the heat sink 40 (precisely, in the interior space of the case 46 attached to the heat sink 40). Thus the power modules 26 are installed as spaced apart from each other such that spaces 50 are each formed between one of the power modules 26 and another one thereof, i.e., defined by the adjacent power modules 26. In FIG. 3, three of the power modules 26 arranged in parallel in the lower line in the drawing are those having the high side switches and the other three arranged in parallel in the upper line are those having the low side switches.

Figure 4:
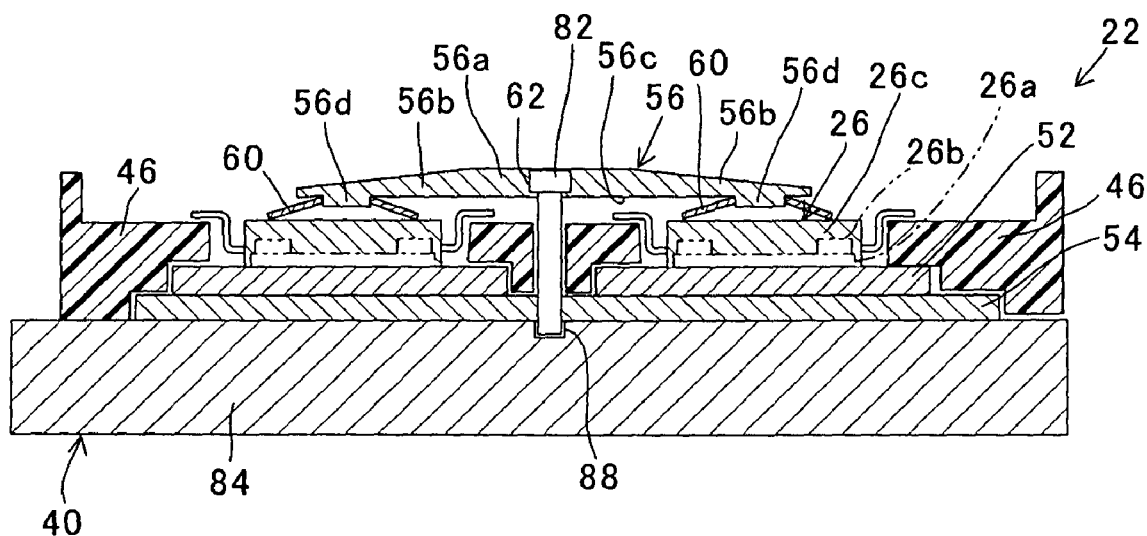
FIG. 4 is a sectional view schematically showing a power module shown in FIG. 3 as viewed from the right side in the drawing.

FIG. 4 is a sectional view schematically showing the power modules 26 shown in FIG. 3 as viewed from the right side in the drawing.

As shown in FIG. 4, each power module 26 equipped with a base plate 26a and electronic components, i.e., IGBTs (Insulated-Gate Bipolar Transistor; hereinafter referred to as "heat-generating component") 26b that are installed on the base plate 26a and generate heat when operated, is formed by molding an encapsulation resin 26c to cover the heat-generating component 26b and the base plate 26a. In the embodiments, a positional relationship of upper and lower sides is described on the premise that, in the PDU 22 shown in FIG. 2, the power module 26 side is the upper side and the heat sink 40 side is the lower side.

Thermal diffusion plates 52 made of a heat-conductive material (e.g., copper) and a thermal-conductive insulation sheet 54 installed below the thermal diffusion plates 52 are interposed between the power modules 26 and the heat sink 40.

A press member 56 is provided above the two power modules 26 and spring members 60 of a substantially circular shape are installed between the power modules 26 and the press member 56. Specifically, one press member 56 is provided above one power module 26 on the high side switch side and another power module 26 on the low side switch side constituting the single-phase inverter circuit. In the PDU 22, since the three single-phase inverter circuits are connected in parallel as mentioned above, accordingly the three press members 56 are installed.

The press member 56 has a substantially I-shape in a plan view, as can be clearly seen in FIG. 3, and made of iron (e.g., JIS (Japanese Industrial Standard) SS400). The press member 56 comprises a screw inserting portion 56a having a screw inserting hole 62 at its center and two arms 56b formed continuously with the screw inserting portion 56a. The two arms 56b are formed around the screw inserting hole 62 at intervals of 180 degrees between each other.

Projections 56d protrude from the undersurface 56c (the surface facing the power modules 26) of the press member 56, i.e., of the arms 56b of the press member 56. A distance between one projection 56d and the screw inserting hole 62 is substantially the same as that between the other projection 56d and the hole 62.

Figure 5A:
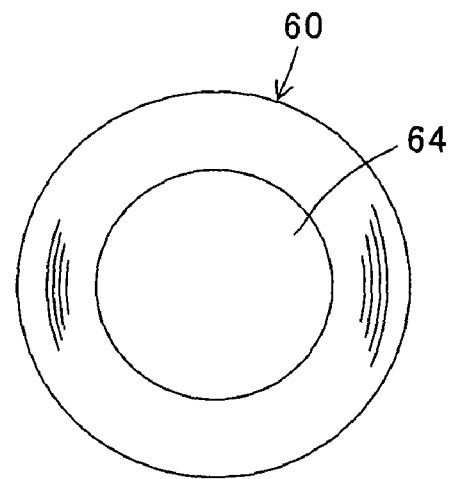
FIGS. 5A and 5B are an enlarged plan view and an enlarged sectional view both showing a spring member shown in FIG. 3 etc.
Figure 5B:
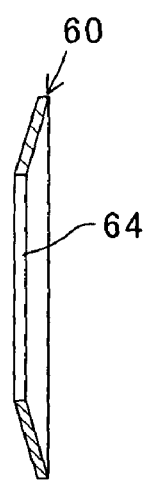

FIGS. 5A and 5B are an enlarged plan view and an enlarged sectional view both showing the spring member 60 shown in FIGS. 3, 4 etc.

The spring member 60 has a substantially circular shape as mentioned above and made of stainless material (e.g., JIS (Japanese Industrial Standard) SUS301-CSP-H). The center of the spring member 60 is bored with an engagement hole 64 to be engaged with the projection 56d of the press member 56. Thus the spring member 60 is constituted as a so-called disc spring (elastic member).

As can be seen in FIG. 4, the above-mentioned heat-generating components 26b are each disposed at a position in the power module 26 between the spring member 60 and the heat sink 40, in other words at a position where downward pressing force from the press member 56 is affected via the spring member 60.

The explanation of FIGS. 2 and 3 will be resumed. The three capacitors 44 are installed in the spaces 50 defined by the adjacent power modules 26 on the heat sink 40. Specifically, all the three capacitors 44 are installed in the spaces 50 defined by the adjacent power modules 26 on the low side switch side (indicated by reference 50a in FIG. 3), while no capacitor is installed in the spaces 50 formed between the power modules 26 on the high side switch side (indicated by reference 50b in FIG. 3).

The capacitors 44 are each equipped with the P-terminal (positive electrode terminal) 70 and the N-terminal (negative electrode terminal) 72. The P-terminal 70 is connected to the high potential terminal (not shown) of the battery 24 and the input terminal (invisible in the figure) on the high side switch side of the power module 26. On the other hand, the N-terminal 72 is connected to the low potential terminal (not shown) of the battery 24 and the input terminal (invisible in the figure) on the low side switch side of the power module 26. The output terminals (neither invisible in FIGS. 2, 3) on the high and low side switch sides of the power modules 26 are connected to each other via a bus bar 74 and the output terminal 74a of the bus bar 74 protrudes toward the exterior of the PDU 22.

The case 46 is made of an insulating material (e.g., resin material) and is formed to surround the power modules 26, capacitors 44, thermal diffusion plates 52, thermal-conductive insulation sheet 54 and the like. In the case 46, three rotation prevention walls (rotation preventers) 76 are each provided at a position corresponding to the screw inserting portion 56a of the press member 56.

Figure 6:
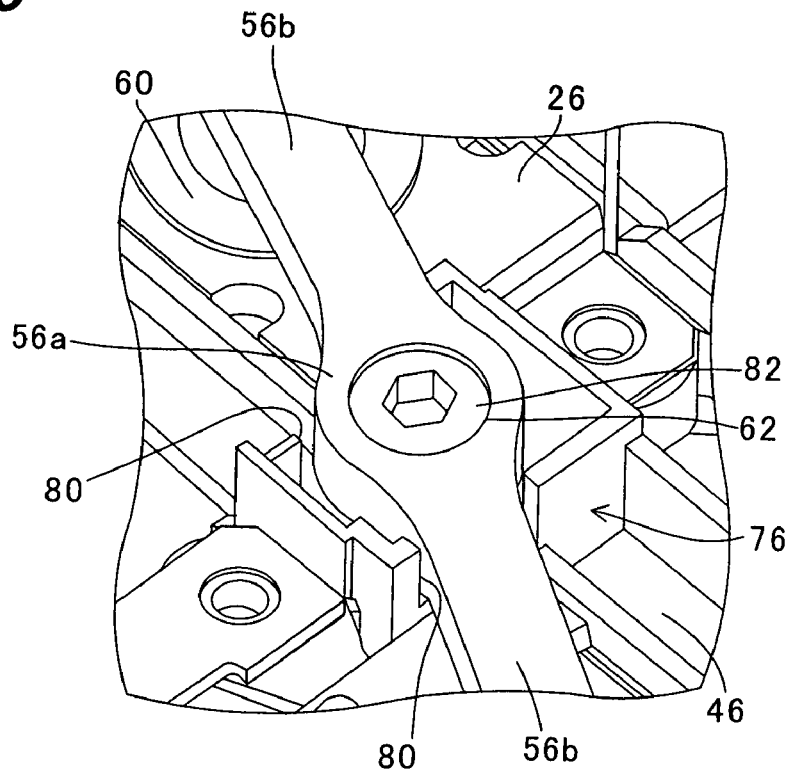
FIG. 6 is an enlarged perspective view showing a region of a rotation prevention wall shown in FIG. 2.

FIG. 6 is an enlarged perspective view showing a region of the rotation prevention wall 76 shown in FIG. 2.

The rotation prevention wall 76 of a substantially square shape in a plan view is formed to surround the screw inserting portion 56a (precisely, the screw inserting hole 62 thereof) of the press member 56. Rectangular notches 80 are formed at positions where the arms 56b extending from the screw inserting portion 56a are to be located.

Owing to this configuration, when, for example, a screw 82 is inserted into the screw inserting hole 62 of the press member 56 and fastened (i.e., turned clockwise), the arms 56b of the press member 56 make contact with the notches 80 of the rotation prevention wall 76, thereby preventing the press member 56 from rotating. Similarly, when the screw 82 is turned counterclockwise to be loosened, the arms 56b are also make contact with the notches 80, so the press member 56 is not rotated. Thus the case 46 attached to the heat sink 40 is provided with the rotation prevention wall 76 for preventing rotation of the press member 56.

Figure 7:
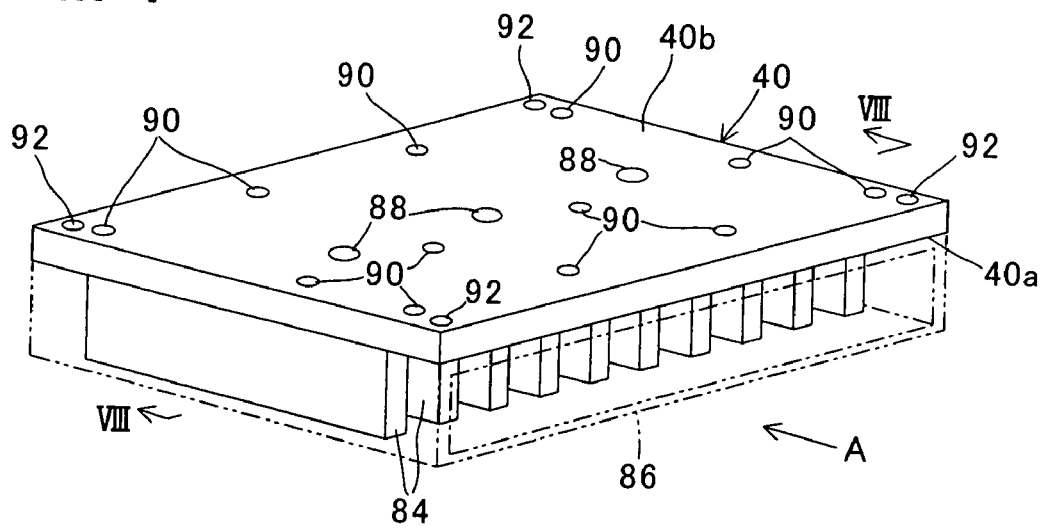
FIG. 7 is a perspective view of a heat sink shown in FIG. 2 etc.
Figure 8:
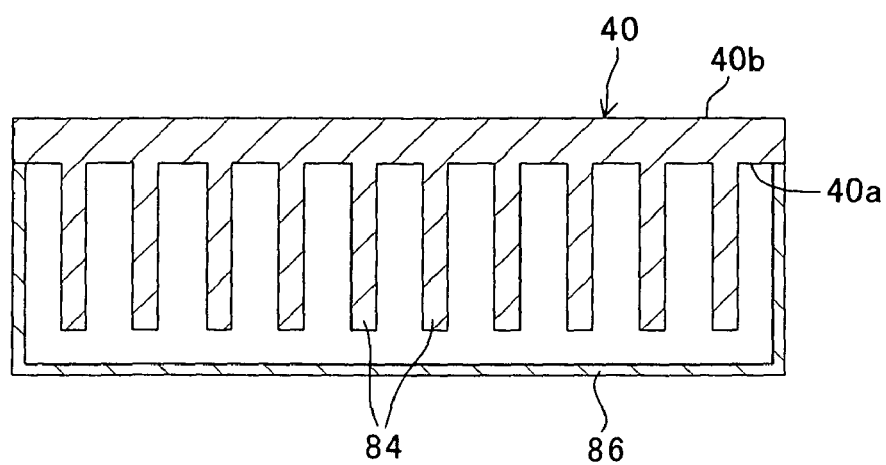
FIG. 8 is a schematic sectional view taken along line VIII-VIII in FIG. 7.

FIG. 7 is a perspective view of the heat sink 40 shown in FIG. 2 etc. and FIG. 8 is a schematic sectional view taken along line VIII-VIII in FIG. 7.

The heat sink 40 is made of a material having thermal conductivity such as aluminum and formed at its undersurface 40a with a plurality of cooling fins 84. As illustrated, the cooling fins 84 are protruded and lie in a direction orthogonal to the longitudinal direction of the heat sink 40, i.e., in a direction parallel to a flow direction of cooling air which will be explained later.

The cooling fins 84 are attached with a duct 86 (indicated by imaginary lines in FIG. 7) for circulating the cooling air. With this, heat generated in the power modules 26, for example, is transmitted to the cooling fins 84 of the heat sink 40 through the thermal diffusion plate 52, thermal-conductive insulation sheet 54 and the like, whereafter the heat is released or radiated (cooled) by the cooling air flowing through the duct 86.

The top surface (the surface to be attached with the case 46) 40b of the heat sink 40 is bored with three screw holes 88 at positions corresponding to the screw inserting holes 62. The top surface 40b of the heat sink 40 is also bored at appropriate positions with a plurality of, i.e., twelve case attachment holes 90 used for attaching the case 46 and at four corners with cover attachment holes 92 used for attaching a cover (not shown).

Next, an assembling process of the PDU 22 which is configured as explained above will be explained with reference to FIGS. 2 to 4.

First, the thermal-conductive insulation sheet 54 is installed on the heat sink 40, and the thermal diffusion plates 52 are installed thereon. Next the case 46 is installed on the heat sink 40 and the twelve screws 94 (one is not shown in FIGS. 2, 3) are inserted into the case attachment holes 90 through the case 46 such that the case 46 is fastened to the heat sink 40. The six power modules 26 are disposed on the heat sink 40 in zigzag arrangement through the thermal diffusion plates 52 and thermal-conductive insulation sheet 54.

After providing each spring member 60 in the vicinity of the center of the power module 26, the press members 56 are positioned on the spring members 60. Positioning of the screw inserting portion 56a of the press member 56 is done by setting the screw inserting portion 56a in the interior space defined by the rotation prevention wall 76. Specifically, the rotation prevention wall 76 also has a function of positioning of the press member 56 with respect to the case 46.

The press members 56 are, as the projections 56d being engaged to the engagement holes 64 of the spring members 60, moved downward. As explained in the foregoing, since the distance between one projection 56d and the screw inserting hole 62 is substantially the same as that between the other projection 56d and the hole 62, accordingly the two (a plurality of) power modules 26 are placed at the same distance from the screw inserting hole 62.

The screws 82 are inserted into the screw inserting holes 62 and the screw holes 88 of the heat sink 40. In other words, the screw 82 is fastened so that the arms 56b of the press member 56 press the power modules 26 downward through the spring members 60. Thus the six power modules 26 are, while being pressed by the press members 56, fastened or fixed to the heat sink 40. The force acted on the spring member 60 at this time is about 1.5 to 2.0 kN or thereabout.

The capacitors 44 are installed in the spaces 50a and connected to the power modules 26 and battery 24, while the signal pins 48 of the power modules 26 are electrically connected to an electric circuit board which is not shown. Then unshown screws are inserted into the cover attachment holes 92 and attachment holes bored in the cover (not shown) so as to fasten the cover to the heat sink 40, thereby completing the PDU 22.

Subsequently the duct 86 is attached to the cooling fins 84 of the heat sink 40 as shown in FIG. 7 so that the cooling air flowing therethrough cools down the power modules 26. Specifically, the cooling air flowing through the duct 86 is circulated in a direction parallel to the cooling fins 84 as indicated by arrows A in FIGS. 3 and 7. As mentioned above, the power modules 26 are pressed to the heat sink 40 by the press members 56 through the spring members 60, so the heat sink 40 is thermally connected to the power modules 26. Therefore, heat of the power modules 26 is transmitted to the heat sink 40 (precisely, the cooling fins 84 thereof) through the thermal diffusion plate 52 and thermal-conductive insulation sheet 54 and the cooling fins 84 are cooled down by the cooling air of the duct 86. The power modules 26 are thus cooled down.

In this embodiment, due to the zigzag arrangement of the power modules 26, the cooling air which is heated by heat of the power modules 26 on the windward side (i.e., high side switch side) is not hit against the cooling fins 84 located below the power modules 26 on the downwind side (i.e., low side switch side). In other words, the cooling air at the relatively low temperature can be directly hit against all the cooling fins (radiating section) 84 disposed on the heat sink 40 in the vicinity of the positions where a plurality of the power modules 26 are fastened, thereby enabling to efficiently cool down the power modules 26.

As stated above, according to the first embodiment, it is configured to have a power drive unit (PDU 22) for supplying current to an electric motor (20), comprising; a heat sink (40); a power module (26) pressed by a press member (56) to the heat sink to be fastened thereto; and a spring member (60) that has a substantially circular shape and is installed between the power module and the press member. Specifically the power module 26 is fastened to the heat sink 40 without providing a screw inserting hole or the like in the power module 26, by being pressed by the press member 56 through the spring member 60. With this, the power modules 26 can be fastened to the heat sink 40 without incurring layout limitation, degradation of heat release performance and the like. Further, since the heat-generating component 26b is installed at a position in the power module 26 and between the spring member 60 and heat sink 40, specifically a position on which the pressing force from the press member 56 to the heat sink 40 acts, adhesion (i.e., thermal bonding) of the heat-generating component 26b with the heat sink 40 is improved and it makes possible to efficiently transmit heat of the heat-generating component 26b to the heat sink 40, thereby enhancing heat release performance. Furthermore, since the spring member 60 is configured to have a circular shape, in the case that the thermal diffusion plates 52 are interposed between the power modules 26 and heat sink 40, the spring members 60 can absorb height (thickness) variance depending on combinations of power modules 26 and the thermal diffusion plates 52, thereby making loads acting on the power modules 26 uniform.

The power drive unit (PDU 22) further includes a projection (56d) that protrudes from the press member (56) to be engaged with an engagement hole (64) bored at the center of the spring member (60). Engagement of the projection 56d of the press member 56 with the engagement hole 64 of the spring member 60 functions to prevent displacement of the press member 56 relative to the spring member 60, thereby making loads acting on the power modules 26 uniform more.

It is configured to have a power drive unit (PDU 22) for supplying current to an electric motor (20), comprising; a heat sink (40); a plurality of power modules (26) pressed by a press member (56) to the heat sink to be fastened thereto; and a spring member (60) that has a substantially circular shape and is installed between each of the power modules and the press member. With this, it becomes possible to achieve the same effects as that explained in the foregoing. Further, loads acting on a plurality of the power modules 26 can be made uniform more compared to a technique which is configured to press power modules using one spring member, thereby enabling to securely fastening the power modules 26 to the heat sink 40.

Furthermore, since a plurality of the power modules 26 are pressed by the press member 56 all at once to be fastened to the heat sink 40, assembly processes can be reduced.

In the power drive unit (PDU 22), the press member (56) is bored with a screw inserting hole (62) and the heat sink (40) is bored with a screw hole (88) at a position corresponding to the screw inserting hole. With this, the power modules 26 can be fastened to the heat sink 40 only by inserting one screw 82 into the screw inserting hole 62 of the press member 56 and the screw hole 88 of the heat sink 40, in other words, a number of components can be reduced compared to a technique which requires a plurality of screws.

In the power drive unit (PDU 22), a plurality of the power modules (26) are placed at a same distance from the screw inserting hole (62). Specifically, each of the power modules 26 is placed at the same distance from the screw inserting hole 62 where the pressing force is generated by tightening the screw 82. With this, loads acting on a plurality of the power modules 26 can be made uniform more. Also it becomes possible to place the power modules 26 spaced apart from each other so that each power module 26 is not easily affected by heat generated by the adjacent power module 26.

The power drive unit (PDU 22) further includes a case (46) that accommodates the press member (56); and a rotation preventer (rotation prevention wall 76) provided on the case to prevent the press member from rotating. With this, when, for example, the press member 56 is fastened with a screw 82, it becomes possible to prevent the press member 56 from rotating, so the press member 56 can be easily connected to the heat sink 40 through the case 46.

In the power drive unit (PDU 22), a plurality of the power modules (26) are arranged in zigzag on the heat sink (40). Thus a plurality of the power modules 26 are arranged in zigzag on the heat sink 40, in other words, the power modules 26 are installed as spaced apart from each other such that the spaces 50 are formed between one of the power modules 26 and another one of the power modules 26. With this, heat generated by one power module 26 does not affect another power module 26, thereby avoiding lowering power conversion efficiency (ratio between power supplied from the battery 24 and power supplied to the motor 20), in other words, influence of heat generated by the power modules 26 can be restrained. Further, since a plurality of the power modules 26 are arranged in zigzag on the heat sink 40, when the cooling air is circulated along the cooling fins 84 of the heat sink 40 to cool down the power modules 26, the cooling air at the relatively low temperature can be directly hit against all the cooling fins (radiating section) 84 disposed on the heat sink 40 in the vicinity of the positions where a plurality of the power modules 26 are fastened, thereby enabling to efficiently cool down the power modules 26.

The power drive unit (PDU 22) further includes a capacitor (44) that is connected to each of the power modules (26) and is installed in a space (50) defined by the adjacent power modules (26) on the heat sink (40). With this, the size of the PDU 22 in the height direction can be reduced compared to a technique which is configured to install a capacitor on a power module, so the whole size of the PDU 22 can be compact. Specifically, in the technique which is configured to install a capacitor on a power module, the size of a PDU in the height direction increases by the height of the capacitor, resulting in increase in the whole size of the PDU disadvantageously. However, since this embodiment is configured as explained above, the size of the PDU in the height direction can be reduced, thereby making the whole size of the PDU compact. Further, since it becomes possible to install a capacitor 44 near the power module 26, the length of wiring, i.e., a line connecting the capacitor 44 and the power module 26 can be short, thereby reducing line impedance which is proportional to the length of wiring. As a result, within a range of allowable surge voltage, the switching speed of the power module 26 can be improved.

In the power drive unit (PDU 22), a number of a plurality of the power modules 26 is two. Since the two power modules 26 are pressed by the press member 56, it becomes possible to achieve the same effects as that explained in the foregoing.

A power drive unit according to a second embodiment will be explained.

Figure 9:
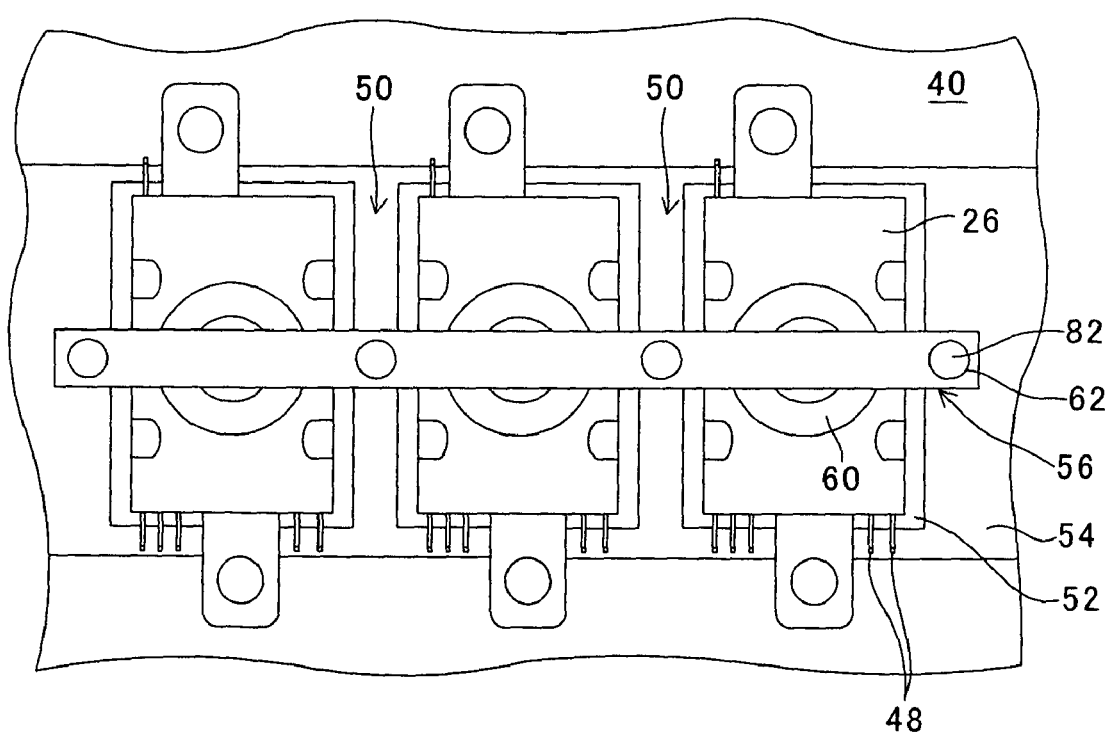
FIG. 9 is an enlarged plan view schematically showing a region of power modules of a power drive unit according to a second embodiment of the invention.
Figure 10:
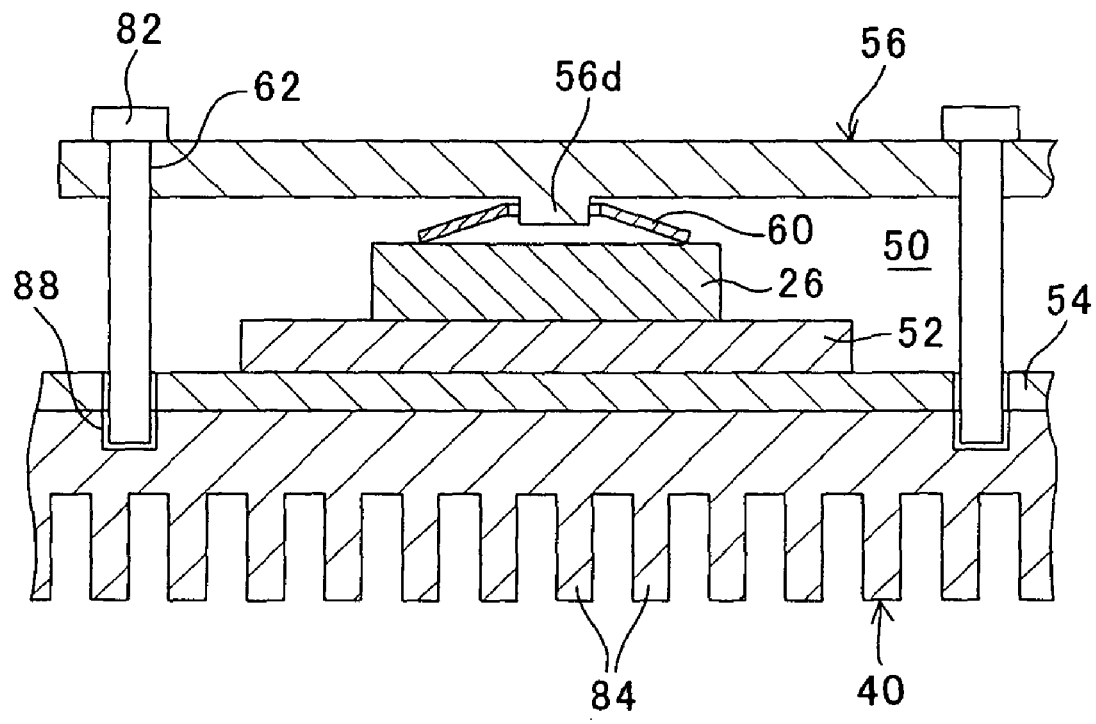
FIG. 10 is an enlarged sectional view partially showing the power module shown in FIG. 9.

FIG. 9 is an enlarged plan view schematically showing a region of power modules 26 of the power drive unit according to the second embodiment and FIG. 10 is an enlarged sectional view partially showing the power module 26 shown in FIG. 9. In FIGS. 9, 10, the case 46 and the like are not illustrated.

The explanation will be made with focus on points of difference from the first embodiment. In the second embodiment, as shown in FIGS. 9, 10, each power module 26 includes both the high side switch and low side switch, and the three power modules 26 are connected or arranged in parallel to constitute a three-phase inverter circuit module, while the three power modules 26 are pressed to the heat sink 40 by one press member 56 to be fastened thereto.

Explaining in detail, four screw inserting holes 62 are bored at appropriate positions in the press member 56. Precisely, the holes 62 are bored at positions in the vicinity of the both ends of the press member 56 and positions corresponding to spaces 50 defined by the power modules 26 with the press member 56 being placed on the three power modules 26. Screw holes 88 are bored in the heat sink 40 at positions corresponding to the screw inserting holes 62.

When the screws 82 are inserted into the screw inserting holes 62 and screw holes 88 and tightened, the press member 56 presses the power modules 26 downward through the spring members 60, i.e., the three power modules 26 are pressed by the one press member 56 all at once to be fastened to the heat sink 40.

Thus, since the PDU 22 according to the second embodiment is configured such that the three power modules 26 are pressed by the one press member 56 all at once to be fastened to the heat sink 40, it becomes possible to achieve the same effect as the first embodiment.

The remaining configuration is the same as that in the first embodiment.

A power drive unit according to a third embodiment will be explained.

Figure 11:
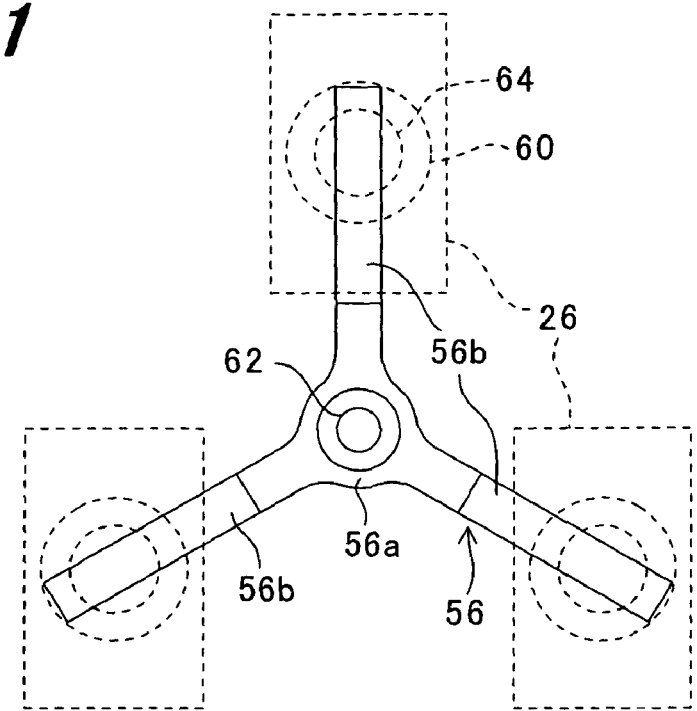
FIG. 11 is a plan view of an alternative example of a press member which is a constituent of a power drive unit according to a third embodiment of the invention.

FIG. 11 is a plan view of an alternative example of a press member 56 which is a constituent of the power drive unit according to the third embodiment of the invention.

The explanation will be made with focus on points of difference from the first embodiment. In the third embodiment, as shown in FIG. 11, a screw inserting portion 56a of a press member 56 is formed with three arms 56b. The three arms 56b are arranged around a screw inserting hole 62 of the screw inserting portion 56a at intervals of 120 degrees between each other. As a result, the power modules 26 (precisely, the centers of the power modules 26) are allocated around the screw inserting hole 62 at the same distance therefrom at intervals of 120 degrees, as indicated by dashed lines.

As stated above, in the power drive unit (PDU 22) according to the third embodiment, a number of a plurality of the power modules (26) is three. Since the three arms 56b of the press member 56 are provided, the one press member 56 can press the three power modules 26 to the heat sink 40 all at once to be fastened thereto.

The remaining configuration and effects are the same as those in the foregoing embodiments.

A power drive unit according to a fourth embodiment will be explained.

Figure 12:
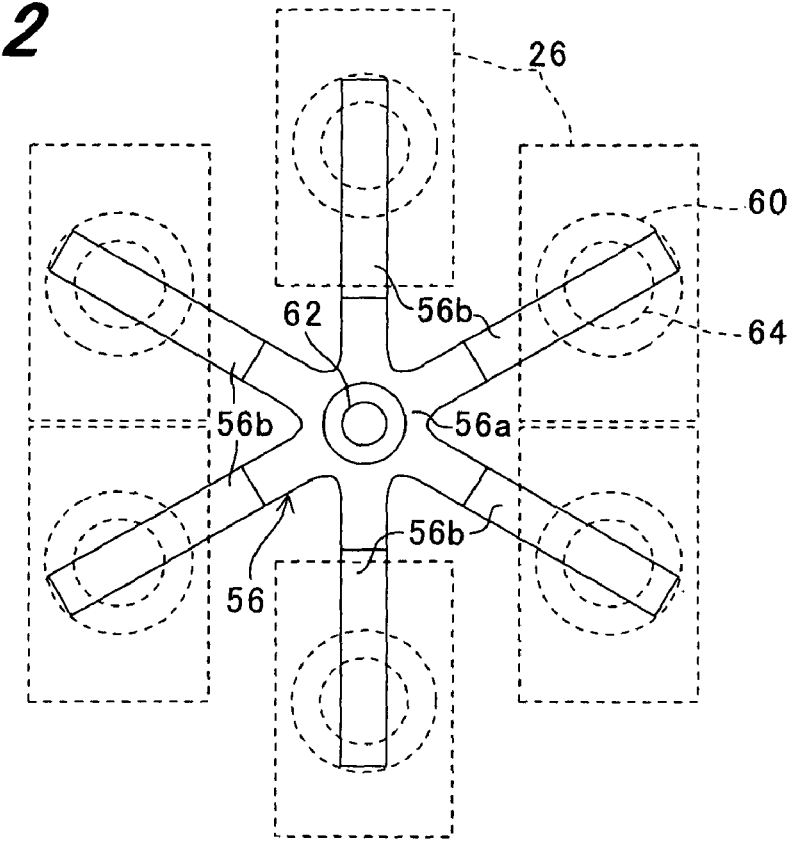
FIG. 12 is a plan view similar to FIG. 11, but showing another alternative example of a press member which is a constituent of a power drive unit according to a fourth embodiment of the invention.

FIG. 12 is a plan view similar to FIG. 11, but showing another alternative example of a press member 56 which is a constituent of a power drive unit according to the fourth embodiment.

The explanation will be made with focus on points of difference from the first embodiment. In the fourth embodiment, as shown in FIG. 12, a screw inserting portion 56a of a press member 56 is formed with six arms 56b. The six arms 56b are arranged around a screw inserting hole 62 of the screw inserting portion 56a at intervals of 60 degrees between each other. As a result, the power modules 26 (precisely, the centers of the power modules 26) are allocated around the screw inserting hole 62 at the same distance therefrom at intervals of 60 degrees, as indicated by dashed lines.

As stated above, in the power drive unit (PDU 22) according to the fourth embodiment, a number of a plurality of the power modules (26) is six. Since the six arms 56b of the press member 56 are provided, the one press member 56 can press the six power modules 26 to the heat sink 40 all at once to be fastened thereto.

The remaining configuration and effects are the same as those in the foregoing embodiments.

It should be noted that, although the PDU 22 is mounted on the hybrid vehicle in the foregoing, the PDU 22 according to this invention can be applied to an electric vehicle.

Japanese Patent Application Nos. 2007-333581, 2007-333582 and 2007-333583 all filed on Dec. 26, 2007, are incorporated herein in its entirety.

While the invention has thus been shown and described with reference to specific embodiments, it should be noted that the invention is in no way limited to the details of the described arrangements; changes and modifications may be made without departing from the scope of the appended claims.

What is claimed is:

1. A power drive unit for supplying current to an electric motor, comprising;
   a heat sink connected to the power drive unit to dissipate heat generated by the power drive unit in supplying current to the electric motor;
   a power module pressed by a press member to the heat sink to be fastened thereto;
   a spring member that has a substantially circular shape from a top view with a center engagement hole and a perimeter surface and is installed between the power module and the press member;
   a projection that protrudes from the press member to be engaged with the center engagement hole;
   a case that accommodates the press member; and
   a rotation preventer provided on the case to prevent the press member from rotating;
   wherein the perimeter surface of the spring member is in contact with the power module pressing the power module toward the heat sink.

2. A power drive unit for supplying current to an electric motor, comprising;
   a heat sink connected to the power drive unit to dissipate heat generated by the power drive unit in supplying current to the electric motor;
   a plurality of power modules each pressed by a press member to the heat sink to be fastened thereto;
   a spring member that has a substantially circular shape from a top view with a center engagement hole and a perimeter surface and is installed between each of the power modules and the press member;
   a projection that protrudes from the press member to be engaged with the center engagement hole;
   a case that accommodates the press member; and
   a rotation preventer provided on the case to prevent the press member from rotating;
   wherein the perimeter surface of the spring member is in contact with the power module pressing the power module toward the heat sink.

3. The power drive unit according to claim 2, wherein the press member is bored with a screw inserting hole and the heat sink is bored with a screw hole at a position corresponding to the screw inserting hole.

4. The power drive unit according to claim 3, wherein the plurality of power modules are placed at a same distance from the screw inserting hole.

5. The power drive unit according to claim 2, wherein the plurality of power modules are arranged in a zigzag pattern on the heat sink.

6. The power drive unit according to claim 5, further including:
   a capacitor that is connected to each of the power modules and is installed in a space defined by the adjacent power modules on the heat sink.

7. The power drive unit according to claim 2, wherein a number of the plurality of power modules is two.

8. The power drive unit according to claim 2, wherein a number of the plurality of power modules is three.

9. The power drive unit according to claim 2, wherein a number of the plurality of power modules is six.

* * * * *